US010404265B1

(12) United States Patent
Farley et al.

(10) Patent No.: US 10,404,265 B1
(45) Date of Patent: Sep. 3, 2019

(54) CURRENT-MODE FEEDBACK SOURCE FOLLOWER WITH ENHANCED LINEARITY

(71) Applicant: Xilinx, Inc., San Jose, CA (US)

(72) Inventors: Brendan Farley, Donabate (IE); Bruno Miguel Vaz, Sao Domingos de Rana (PT); Darragh Walsh, Cork (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/117,650

(22) Filed: Aug. 30, 2018

(51) Int. Cl.
*H03M 1/80* (2006.01)
*H03F 3/30* (2006.01)

(52) U.S. Cl.
CPC ............. *H03M 1/802* (2013.01); *H03F 3/305* (2013.01); *H03M 2201/518* (2013.01); *H03M 2201/8132* (2013.01)

(58) Field of Classification Search
CPC ........... H03M 1/802; H03M 2201/518; H03M 2201/8132; H03M 1/12; H03M 1/124; H03F 1/083; H03F 1/086; H03F 3/505; H03F 2203/5031
USPC .................. 341/135, 136, 155; 327/108, 111
See application file for complete search history.

(56) References Cited

U.S. PATENT DOCUMENTS

| | | | | |
|---|---|---|---|---|
| 7,668,238 | B1 | 2/2010 | Rokhsaz | |
| 7,804,328 | B2 * | 9/2010 | Pentakota | H03F 3/505 326/31 |
| 7,924,912 | B1 | 4/2011 | Rokhsaz et al. | |
| 9,628,099 | B2 * | 4/2017 | Sakurai | H03K 19/01812 |
| 9,654,057 | B2 * | 5/2017 | Marie | H03F 1/083 |

* cited by examiner

*Primary Examiner* — Khai M Nguyen
(74) *Attorney, Agent, or Firm* — Patterson + Sheridan, LLP; Robert M. Brush

(57) ABSTRACT

An example apparatus includes a first transistor coupled between a supply node and a first node, a current mirror having a first side and a second side, and a second transistor coupled between the first node and the first side of the current mirror. The input buffer further includes a third transistor coupled between the first node and the second side of the current mirror, and a first capacitor coupled between a source and a drain of the second transistor.

20 Claims, 7 Drawing Sheets

CURRENT-MODE FEEDBACK SOURCE FOLLOWER WITH ENHANCED LINEARITY

GOVERNMENT RIGHTS

This invention was made, in part, with Government support under Agreement No. HR0011-16-3-0004, awarded by Defense Advanced Research Projects Agency. The Government has certain rights in the invention.

TECHNICAL FIELD

Examples of the present disclosure generally relate to electronic circuits and, in particular, to a current-mode feedback source follower with enhanced linearity.

BACKGROUND

High-performance analog-to-digital converters (ADCs) employ input buffers to present a high impedance input isolated from the switching transients in the ADC front end. Time-interleaved ADCs continue to push ADC bandwidth and linearity higher. As a result, the bandwidth and linearity requirements of the input buffer are pushed higher in order to not limit the ADC performance. Source follower buffers of various configurations can be employed for buffer function. Feedback loops can be employed to enhance the low frequency linearity. The problem with this approach is the high-frequency linearity becomes compromised as the limits of the feedback loop are approached. It is desirable to provide an input buffer that maintains linearity at both high and low frequencies.

SUMMARY

Techniques for providing a current-mode feedback source follower with enhanced linearity are described. In an example, an apparatus includes a first transistor coupled between a supply node and a first node; a current mirror having a first side and a second side; a second transistor coupled between the first node and the first side of the current mirror; a third transistor coupled between the first node and the second side of the current mirror; and a first capacitor coupled between a source and a drain of the second transistor.

In another example, an apparatus includes a first transistor coupled between a supply node and a first node; a current mirror having a first side and a second side; a second transistor coupled between the first node and the first side of the current mirror; a third transistor coupled between the first node and the second side of the current mirror; and a first capacitor coupled between the first node and the current mirror. The current mirror comprises a fourth transistor coupled between the second transistor and a ground node, and a fifth transistor coupled between the third transistor and the ground node.

In another example, a method of manufacturing an input buffer includes: providing a first transistor coupled between a supply node and a first node; providing a current mirror having a first side and a second side; providing a second transistor coupled between the first node and the first side of the current mirror; providing a third transistor coupled between the first node and the second side of the current mirror; and providing a first capacitor coupled between a source and a drain of the second transistor.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
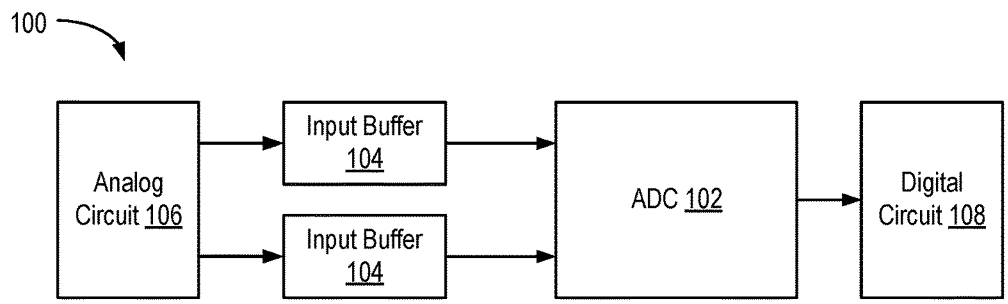
FIG. 1 is a block diagram depicting an analog-to-digital conversion system according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing a current-mode feedback source follower with enhanced linearity are described. In examples, one or two bypass capacitors are added to the current mode feedback loop of a source follower buffer, which significantly improves the linearity, particularly for high bandwidth design. Without the bypass capacitor(s), at high frequency the phase of the current in the feedback loop rotates degrading rather than enhancing the linearity. Introduction of the bypass capacitor(s) in the feedback loop compensates this phase rotation hence improving the linearity at high frequency. The capacitor area penalty is marginal in the context of the overall buffer area. These and further aspects are discussed below with respect to the drawings.

FIG. 1 is a block diagram depicting an analog-to-digital conversion system 100 according to an example. The system 100 includes an analog-to-digital converter (ADC) 102 having a pair of inputs (e.g., a differential input) and an output. Input buffers 104 are coupled to the inputs of the ADC 102. Input buffers 104 provide a high impedance input to the ADC 102 for an analog circuit 106. The input buffers 104 isolate the analog circuit 106 from switching transients in the ADC 102. A digital circuit 108 is coupled to the output of the ADC 102 for processing the digital output thereof. Each input buffer 104 is a source follower buffer that employs a linearity enhancement technique as described herein, which is particularly effective at high frequency. As described further below, the source follower buffer employs one or more bypass capacitors in the current-mode feedback loop to reduce peaking, enhancing linearity, and reducing noise.

Figure 2:
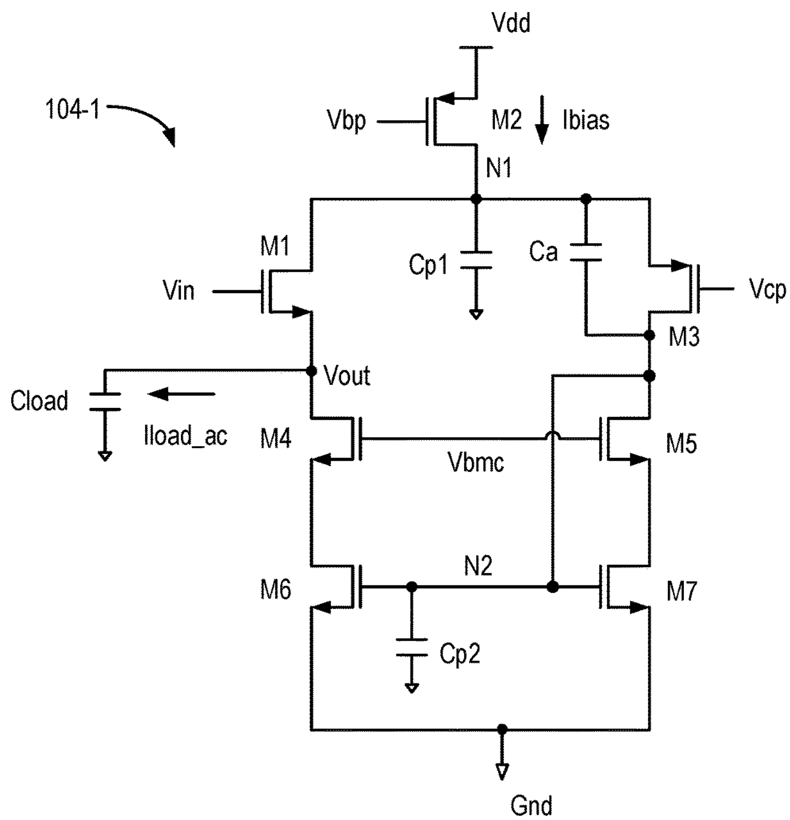
FIG. 2 is a schematic diagram depicting an input buffer according to an example.

FIG. 2 is a schematic diagram depicting an input buffer 104-1 according to an example. The input buffer 104-1 can be used as the input buffers 104 in the system 100 described above. Those skilled in the art will appreciate that the input buffer 104-1 can be used in a myriad of other systems that make use of input buffers to isolate circuits, of which the system 100 is merely one example.

The input buffer 104-1 includes transistors M1, M2, M3, M4, M5, M6, and M7, and capacitors Cp1, Cp2, and Ca. The transistors M1, M4, M5, M6, and M7 are n-channel devices, such as n-type metal oxide field effect transistors (MOSFETs). The transistors M2 and M3 are p-channel devices, such as p-type MOSFETs. A gate of the transistor M1 is coupled to receive an input voltage (Vin). A drain of the transistor M1 is coupled to a node N1. A source of the transistor M1 is coupled to a drain of the transistor M4. A source of the transistor M4 is coupled to a drain of the transistor M6. A source of the transistor M6 is coupled to a node Gnd, which supplies a reference voltage (e.g., electrical ground).

A source of the transistor M2 is coupled to a node Vdd, which supplies a supply voltage with respect to the reference voltage. A gate of the transistor M2 is coupled to receive a bias voltage Vbp. A drain of the transistor M2 is coupled to the node N1. A source of the transistor M3 is coupled to the node N1. A gate of the transistor M3 is coupled to receive a bias voltage Vcp. A drain of the transistor M3 is coupled to a drain of the transistor M5. A source of the transistor M5 is coupled to a drain of the transistor M7. A source of the transistor M7 is coupled to the node Gnd. A gate of the transistor M7 is coupled to a gate of the transistor M6. The gates of the transistors M7 and M6 form a node N2. A gate of the transistor M5 is coupled to a gate of the transistor M4 and has a bias voltage Vbmc. The drains of the transistors M3 and M5 are also coupled to the node N2. The capacitor Cp1 is coupled between the node N1 and the node Gnd. The capacitor Cp2 is coupled between the node N2 and the node Gnd. The capacitor Ca is coupled between the node N1 and the drains of the transistors M3 and M5. A node formed by the source of the transistor M1 and the drain of the transistor M4 provides an output voltage Vout.

In the example, the input buffer 104-1 is a source-follower with a current feedback loop. Transistors M4, M5, M6, and M7 implement a current mirror that draws a bias current through the transistor M1. Although a cascode current mirror is shown in the example, it is to be understood that the input buffer 104-1 can include other types of current sources (e.g., a current mirror without cascode transistors M4 and M5).

A source-follower can be implemented using an n-channel transistor and a current source. The gate of the transistor receives the input voltage and the source of the transistor supplies the output voltage. The current source draws current from a supply through the transistor. Good linearity can be achieved if it is assumed that a constant current flows in the transistor maintaining a constant gate-to-source voltage. However, if the output voltage drives a capacitive load, such as an ADC, the transistor supplies an alternating current (AC) to the load. This modulation of the current conducted by the transistor introduces distortion.

A current feedback loop can be added to a source follower to significantly attenuate the AC current flowing in the transistor to enhance linearity for low input frequencies. Consider the input buffer 104-1 without the capacitor Ca, which is added to implement the techniques described herein and is discussed further below. The bias current, Ibias, is set by transistor M2 (e.g., by implementing transistor M2 with a given width and setting Vbp). The M6:M7 ratio (the ratio of widths between M6 and M7) sets the loop gain (LG). The DC current in the transistor M3 is Ibias/(1+LG) and the DC current that flows in the transistor M1 is LG/(1+LG)*Ibias. For a given input frequency (Fin), the feedback loop senses the AC current at the drain of the transistor M1 and delivers a gained version directly to the load (e.g., Cload representing a capacitive load). The AC current flowing to the load (Iload_ac) is delivered as follows: the transistor M1 delivers Iload_ac/(1+LG) and the transistor M4 (via the transistor M7) delivers LG/(1+LG)*Iload_ac, which is 180 degrees out of phase with the current supplied by the transistor M1. The result is that the portion of Iload_ac flowing in the transistor M1 is attenuated by 1+LG, resulting in improved linearity. However, for high input frequency (Fin), the delay around the loop rotates the phase from 180 degrees. The parasitic capacitors Cp1 and Cp2 will dictate the frequency response of the rotation.

To suppress third harmonic distortion ("HD3 distortion"), the loop must perform to three times the input frequency (Fin). This is in the multiple gigahertz (GHz) range for high input frequency (Fin). The phase rotation of the AC current in the feedback loop will result in the incorrect current being delivered by the feedback loop to the capacitive load. The erroneous AC current delivered to the load is forced to flow in the source of the transistor M1. The gain of the loop means the AC current magnitude can be large, resulting in current peaking in the transistor M1, as the feedback loop senses and gains the erroneous current. The result is a larger current flowing in transistor M1, degrading the linearity at this frequency.

Figure 5:
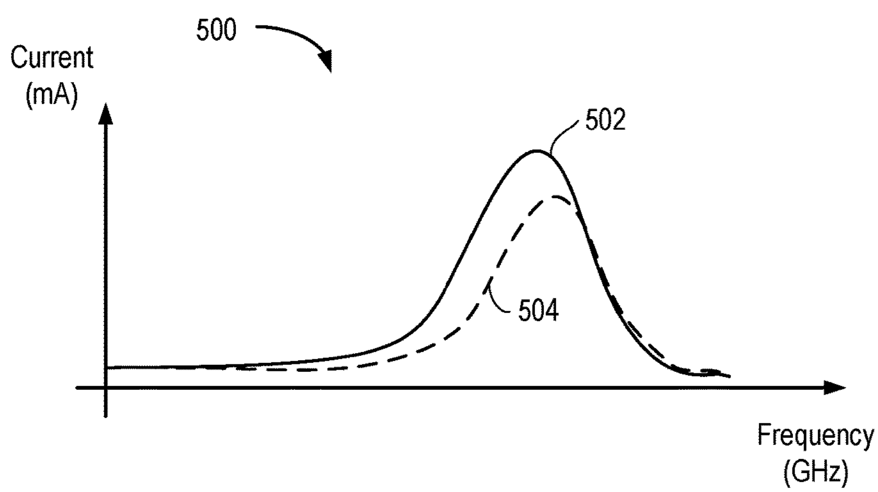
FIG. 5 is a graph illustrating AC current versus frequency according to an example.

FIG. 5 is a graph 500 illustrating AC current versus frequency according to an example. The horizontal axis represents frequency in GHz and the vertical axis represents current in milliamps (mA). A curve 502 shows the current in the transistor M1 over different frequencies. As shown, the current peaks at a particular frequency. The peaking can be reduced by reducing the loop gain, but this will degrade the low frequency improvement achieved by employing the closed loop current feedback technique. If the AC current delivered by the feedback loop that is forced to flow in the transistor M1 approaches the transistor's DC bias current, harsh distortion will occur as the transistor M1 shuts off.

In an example, the capacitor Ca is provided as a bypass across source and drain of the transistor M3. The capacitor Ca compensates for the phase rotation of the feedback current within the feedback loop and significantly improves the linearity for high-bandwidth applications. The addition of the capacitor Ca reduces the current peaking (as shown by the curve 504 in the graph 500 of FIG. 5) in the transistor M1 for a given frequency by compensating the feedback current's phase rotation. For example, for an input frequency of 3.5 GHz, the HD3 frequency is around the 10/11 GHz range. The capacitor Ca can be selected to reduce the peaking in the 10/11 GHz range in such an example. The capacitor Ca is also effectively bootstrapped for low-to-mid range frequencies and thus the capacitor Ca does not impact the current's phase frequency response significantly in this range. The bootstrapping prevents the capacitor Ca from presenting a capacitive load on the feedback loop. As the input frequency increases, the capacitor Ca delivers more and more of the AC current. The capacitor Ca will introduce a 90 degree phase shift to the current therein. This current shifted by 90 degrees reduces the overall current's phase rotation.

Figure 3:
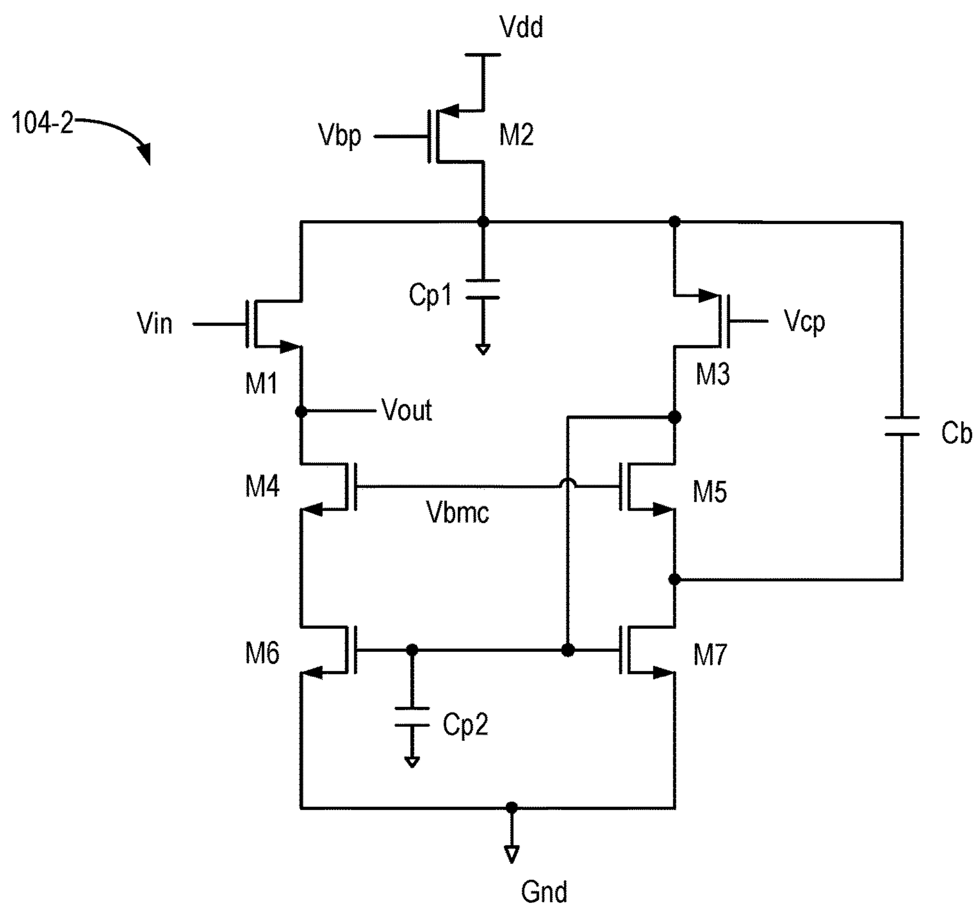
FIG. 3 is a schematic diagram depicting an input buffer according to another example.

FIG. 3 is a schematic diagram depicting an input buffer 104-2 according to another example. The input buffer 104-2 can be used as the input buffers 104 in the system 100 described above. Those skilled in the art will appreciate that the input buffer 104-2 can be used in a myriad of other systems that make use of input buffers to isolate circuits, of which the system 100 is merely one example.

The input buffer 104-2 includes transistors M1, M2, M3, M4, M5, M6, and M7, and capacitors Cp1, Cp2, and Cb. The transistors M1, M4, M5, M6, and M7 are n-channel devices, such as n-type metal oxide field effect transistors (MOSFETs). The transistors M2 and M3 are p-channel devices, such as p-type MOSFETs. A gate of the transistor M1 is coupled to receive an input voltage (Vin). A drain of the transistor M1 is coupled to a node N1. A source of the transistor M1 is coupled to a drain of the transistor M4. A source of the transistor M4 is coupled to a drain of the transistor M6. A source of the transistor M6 is coupled to a node Gnd, which supplies a reference voltage (e.g., electrical ground).

A source of the transistor M2 is coupled to a node Vdd, which supplies a supply voltage with respect to the reference voltage. A gate of the transistor M2 is coupled to receive a bias voltage Vbp. A drain of the transistor M2 is coupled to the node N1. A source of the transistor M3 is coupled to the node N1. A gate of the transistor M3 is coupled to receive a bias voltage Vcp. A drain of the transistor M3 is coupled to a drain of the transistor M5. A source of the transistor M5 is coupled to a drain of the transistor M7. A source of the transistor M7 is coupled to the node Gnd. A gate of the transistor M7 is coupled to a gate of the transistor M6. The gates of the transistors M7 and M6 form a node N2. A gate of the transistor M5 is coupled to a gate of the transistor M4 and has a bias voltage Vbmc. The drains of the transistors M3 and M5 are also coupled to the node N2. The capacitor Cp1 is coupled between the node N1 and the node Gnd. The capacitor Cp2 is coupled between the node N2 and the node Gnd. The capacitor Cb is coupled between the node N1 and the source/drain of the transistors M5/M7, respectively. A node formed by the source of the transistor M1 and the drain of the transistor M4 provides an output voltage Vout.

In the example, the input buffer 104-2 is a source-follower with a current feedback loop. Transistors M4, M5, M6, and M7 implement a current mirror that draws a bias current through the transistor M1. Although a cascode current mirror is shown in the example, it is to be understood that the input buffer 104-2 can include other types of current sources (e.g., a current mirror without cascode transistors M4 and M5).

In an example, the capacitor Cb is provided as a bypass across the node N1 and the source/drain of the transistors M5/M7. The capacitor Cb compensates for the phase rotation of the feedback current within the feedback loop and significantly improves the linearity for high-bandwidth applications. The addition of the capacitor Cb reduces the current peaking (as shown by the curve 504 in the graph 500 of FIG. 5) in the transistor M1 for a given frequency by compensating the feedback current's phase rotation. For example, for an input frequency of 3.5 GHz, the HD3 frequency is around the 10/11 GHz range. The capacitor Cb can be selected to reduce the peaking in the 10/11 GHz range in such an example. The capacitor Cb is also effectively bootstrapped for low-to-mid range frequencies and thus the capacitor Cb does not impact the current's phase frequency response significantly in this range. The bootstrapping prevents the capacitor Cb from presenting a capacitive load on the feedback loop. As the input frequency increases, the capacitor Cb delivers more and more of the AC current. The capacitor Cb will introduce a 90 degree phase shift to the current therein. This current shifted by 90 degrees reduces the overall current's phase rotation.

Figure 4:
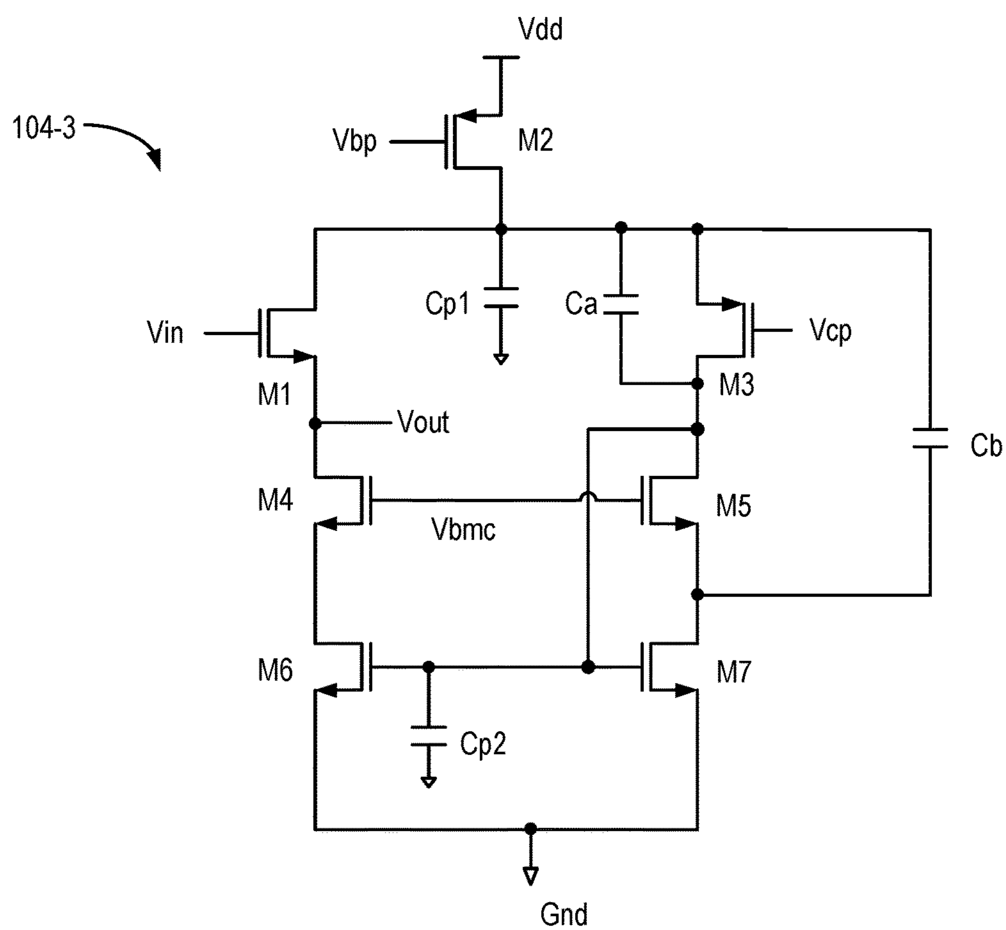
FIG. 4 is a schematic diagram depicting an input buffer according to another example.

FIG. 4 is a schematic diagram depicting an input buffer 104-3 according to another example. The input buffer 104-3 can be used as the input buffers 104 in the system 100 described above. Those skilled in the art will appreciate that the input buffer 104-3 can be used in a myriad of other systems that make use of input buffers to isolate circuits, of which the system 100 is merely one example.

The input buffer 104-3 includes transistors M1, M2, M3, M4, M5, M6, and M7, and capacitors Cp1, Cp2, and Cb. The transistors M1, M4, M5, M6, and M7 are n-channel devices, such as n-type metal oxide field effect transistors (MOSFETs). The transistors M2 and M3 are p-channel devices, such as p-type MOSFETs. A gate of the transistor M1 is coupled to receive an input voltage (Vin). A drain of the transistor M1 is coupled to a node N1. A source of the transistor M1 is coupled to a drain of the transistor M4. A source of the transistor M4 is coupled to a drain of the transistor M6. A source of the transistor M6 is coupled to a node Gnd, which supplies a reference voltage (e.g., electrical ground).

A source of the transistor M2 is coupled to a node Vdd, which supplies a supply voltage with respect to the reference voltage. A gate of the transistor M2 is coupled to receive a bias voltage Vbp. A drain of the transistor M2 is coupled to the node N1. A source of the transistor M3 is coupled to the node N1. A gate of the transistor M3 is coupled to receive a bias voltage Vcp. A drain of the transistor M3 is coupled to a drain of the transistor M5. A source of the transistor M5 is coupled to a drain of the transistor M7. A source of the transistor M7 is coupled to the node Gnd. A gate of the transistor M7 is coupled to a gate of the transistor M6. The gates of the transistors M7 and M6 form a node N2. A gate of the transistor M5 is coupled to a gate of the transistor M4 and has a bias voltage Vbmc. The drains of the transistors M3 and M5 are also coupled to the node N2. The capacitor Cp1 is coupled between the node N1 and the node Gnd. The capacitor Cp2 is coupled between the node N2 and the node Gnd. The capacitor Cb is coupled between the node N1 and the source/drain of the transistors M5/M7, respectively. The capacitor Ca is coupled between the node N1 and the drains of the transistors M3 and M5. A node formed by the source of the transistor M1 and the drain of the transistor M4 provides an output voltage Vout.

In the example, the input buffer 104-3 is a source-follower with a current feedback loop. Transistors M4, M5, M6, and M7 implement a current mirror that draws a bias current through the transistor M1. Although a cascode current mirror is shown in the example, it is to be understood that the input buffer 104-2 can include other types of current sources (e.g., a current mirror without cascode transistors M4 and M5).

In the example of FIG. 4, a combination of the bypass capacitors Ca and Cb discussed above are employed. Smaller values of the capacitor Cb versus the capacitor Ca offer more phase correction as the signal develops across the capacitor Cb at higher frequency is larger hence more current experiences the 90 degree phase shift. The benefit of the capacitor Cb alone is more sensitive to the absolute capacitance value than the capacitor Ca alone. The combination of the capacitors Ca and Cb offers a stable improvement in linearity for minimal area increase. Moderate values of a combination of Ca and Cb can be practically implemented and demonstrate a significant improvement in linearity at high-bandwidth applications.

Figure 6:
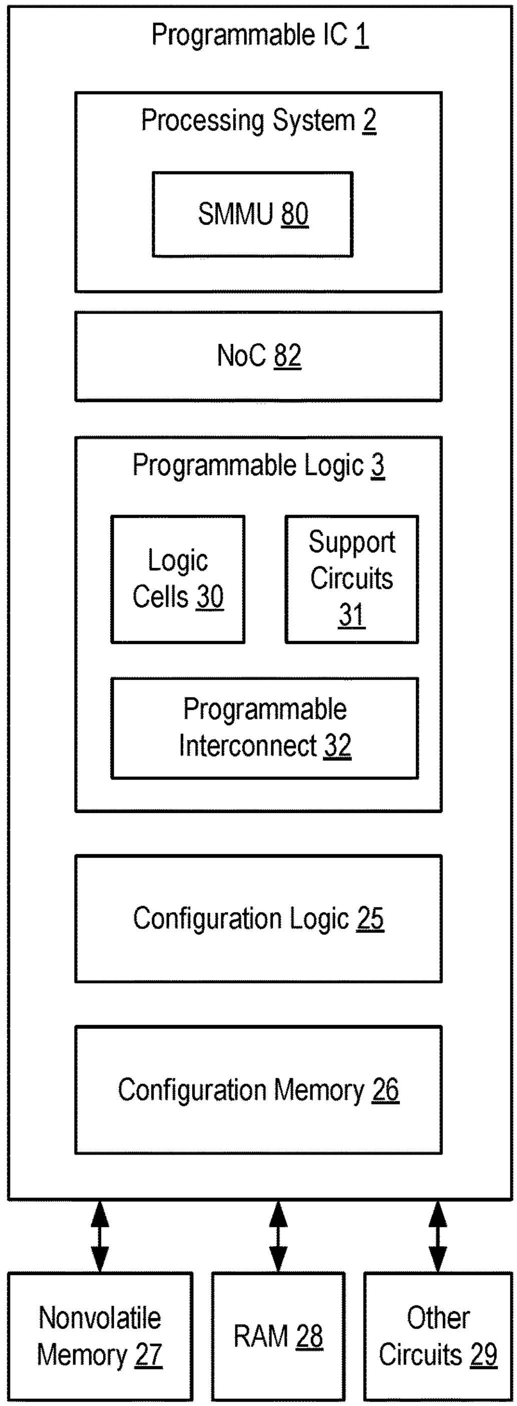
FIG. 6 is a block diagram depicting a programmable IC according to an example.

FIG. 6 is a block diagram depicting a programmable IC 1 according to an example. The programmable IC 1 includes a processing system 2, programmable logic 3, a network on chip (NoC) 82, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). The processing system 2 can include microprocessor(s), memory, support circuits, IO circuits, and the like. In examples described herein, the processing system 2 includes a system memory management unit (SMMU) 80. The SMMU 80 is a separate memory management unit for use by PS and PL masters that do not have a built-in MMU. The NoC 82 includes circuitry for providing physical and logical connections between configured and/or hardened circuits in the programmable IC 1.

Figure 7:
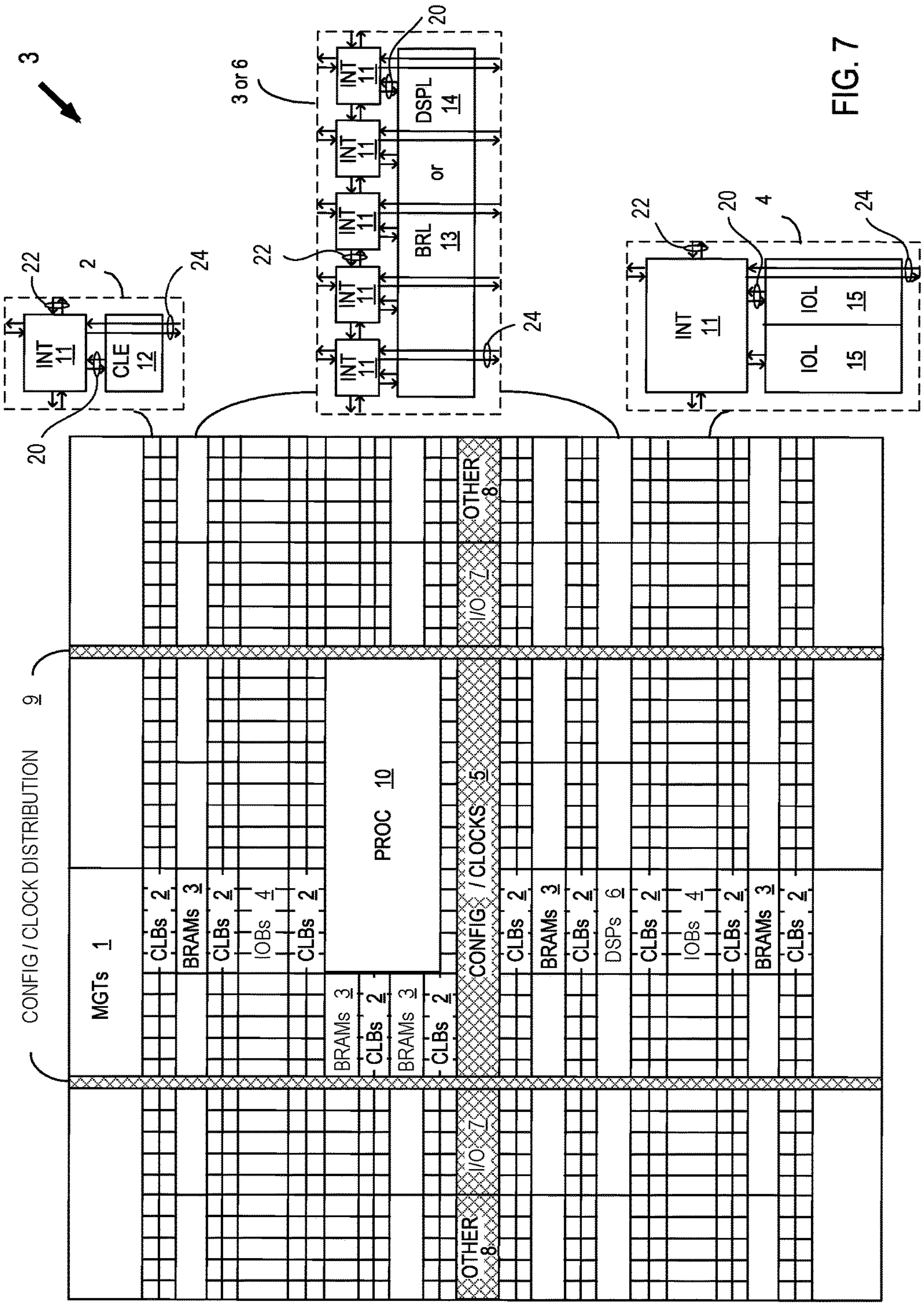
FIG. 7 illustrates programmable logic of a programmable IC according to an example.

FIG. 7 illustrates programmable logic 3 of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The programmable logic 3 can also include PCIe interfaces 40, analog-to-digital converters (ADC) 38, and the like.

In some programmable logic, each programmable tile can include at least one programmable interconnect element ("INT") 43 having connections to input and output terminals 48 of a programmable logic element within the same tile, as shown by examples included at the top of FIG. 7. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated programmable logic.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 7) is used for configuration, clock, and other control logic. Vertical columns 51 extending from this horizontal area or column are used to distribute the clocks and configuration signals across the breadth of the programmable logic.

Some programmable logic utilizing the architecture illustrated in FIG. 7 include additional logic blocks that disrupt the regular columnar structure making up a large part of the programmable logic. The additional logic blocks can be programmable blocks and/or dedicated logic.

Note that FIG. 7 is intended to illustrate only an exemplary programmable logic architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual programmable logic more than one adjacent row of CLBs is typically included wherever the CLBs appear, to facilitate the efficient implementation of user logic, but the number of adjacent CLB rows varies with the overall size of the programmable logic.

Figure 8:
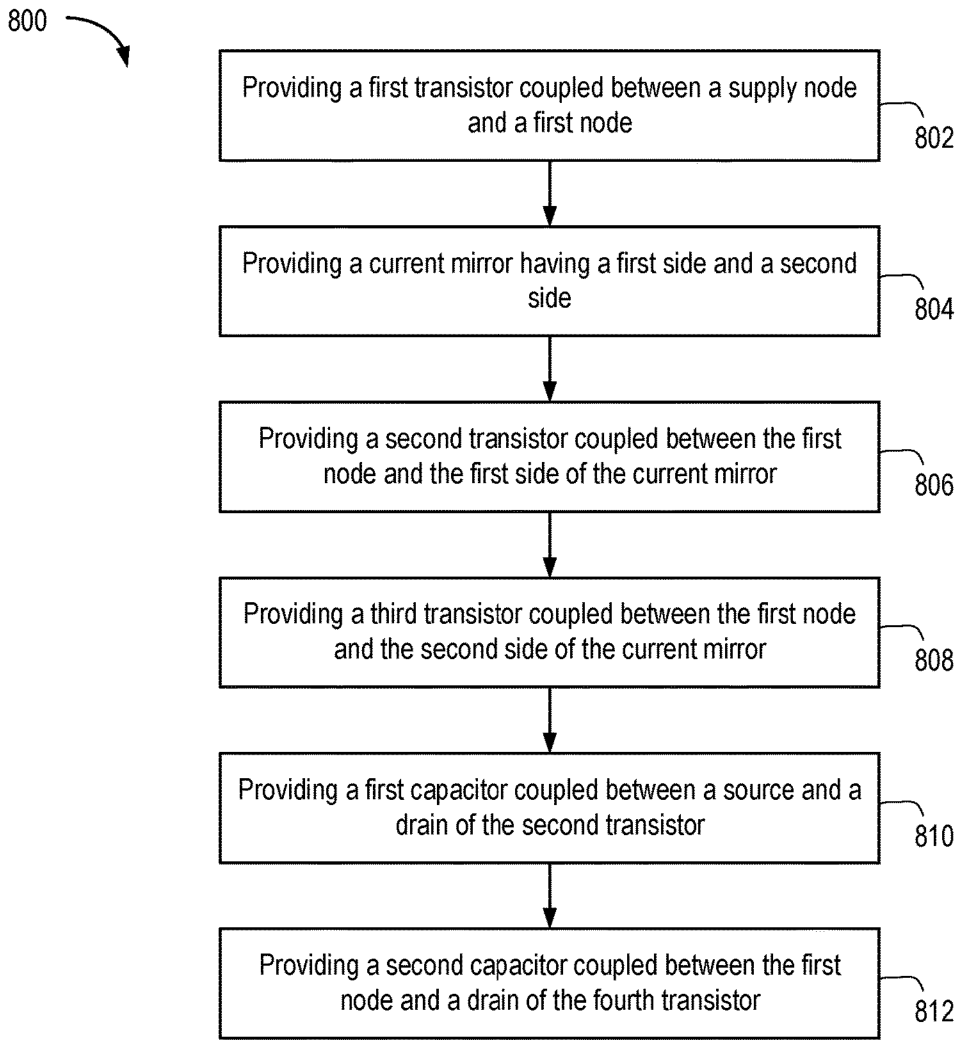
FIG. 8 is a flow diagram depicting a method of manufacturing an input buffer according to an example.

FIG. 8 is a flow diagram depicting a method 800 of manufacturing an input buffer according to an example. The method 800 begins at step 802, where a first transistor (M2) is provided coupled between a supply node (Vdd) and a first node (N1). At step 804, a current mirror (M4-M7) is provided having a first side and a second side. At step 806, a second transistor (M3) is provided coupled between the first node (N1) and the first side of the current mirror (M4-M7). At step 808, a third transistor is coupled between the first node (N1) and the second side of the current mirror (M4-M7). At step 810, a first capacitor (Ca) is provided between a source and a drain of the second transistor (M3).

Optionally, in another example, a second capacitor (Cb) is provided coupled between the first node (N1) and a drain of the fourth transistor (M7).

While the foregoing is directed to specific examples, other and further examples may be devised without departing from the basic scope thereof, and the scope thereof is determined by the claims that follow.

What is claimed is:

1. An apparatus, comprising:

a first transistor coupled between a supply node and a first node;

a current mirror having a first side and a second side;

a second transistor coupled between the first node and the first side of the current mirror;

a third transistor coupled between the first node and the second side of the current mirror; and a first capacitor coupled between a source and a drain of the second transistor.

2. The apparatus of claim 1, wherein the current mirror comprises a fourth transistor coupled between the second transistor and a ground node, and a fifth transistor coupled between the third transistor and the ground node.

3. The apparatus of claim 2, further comprising:

a second capacitor coupled between the first node and a drain of the fourth transistor.

4. The apparatus of claim 2, wherein the current mirror further includes a sixth transistor coupled between the second transistor and the fourth transistor, and a seventh transistor coupled between the third transistor and the fifth transistor.

5. The apparatus of claim 1, wherein a gate of the first transistor is coupled to a first bias voltage and a gate of the third transistor is coupled to an input signal.

6. The apparatus of claim 5, wherein a gate of the second transistor is coupled to a second bias voltage.

7. The apparatus of claim 1, wherein the first transistor, the current mirror, the second transistor, the third transistor, and the first capacitor comprise an input buffer, and wherein the apparatus further comprises:

an analog circuit; and an analog-to-digital converter (ADC), coupled to the analog circuit through the input buffer circuit.

8. The apparatus of claim 7, further comprising:

a digital circuit coupled to an output of the ADC.

9. An apparatus, comprising:

a first transistor coupled between a supply node and a first node;

a current mirror having a first side and a second side;

a second transistor coupled between the first node and the first side of the current mirror;

a third transistor coupled between the first node and the second side of the current mirror; and a first capacitor coupled between the first node and the current mirror;

wherein the current mirror comprises a fourth transistor coupled between the second transistor and a ground node, and a fifth transistor coupled between the third transistor and the ground node.

10. The apparatus of claim 9, wherein the first capacitor is coupled between the first node and a drain of the fifth transistor.

11. The apparatus of claim 9, wherein the current mirror further includes a sixth transistor coupled between the second transistor and the fourth transistor, and a seventh transistor coupled between the third transistor and the fifth transistor.

12. The apparatus of claim 9, wherein a gate of the first transistor is coupled to a first bias voltage and a gate of the second transistor is coupled to a second bias voltage.

13. The apparatus of claim 9, wherein the first transistor, the current mirror, the second transistor, the third transistor, and the first capacitor comprise an input buffer, and wherein the apparatus further comprises:

an analog circuit; and an analog-to-digital converter (ADC), coupled to the analog circuit through an the input buffer circuit.

14. The apparatus of claim 13, further comprising:

a digital circuit coupled to an output of the ADC.

15. A method of manufacturing an input buffer, comprising:

providing a first transistor coupled between a supply node and a first node;

providing a current mirror having a first side and a second side;

providing a second transistor coupled between the first node and the first side of the current mirror;

providing a third transistor coupled between the first node and the second side of the current mirror; and providing a first capacitor coupled between a source and a drain of the second transistor.

16. The method of claim 15, wherein the current mirror comprises a fourth transistor coupled between the second transistor and a ground node, and a fifth transistor coupled between the third transistor and the ground node.

17. The method of claim 16, further comprising:

providing a second capacitor coupled between the first node and a drain of the fourth transistor.

18. The method of claim 16, wherein the current mirror further includes a sixth transistor coupled between the second transistor and the fourth transistor, and a seventh transistor coupled between the third transistor and the fifth transistor.

19. The method of claim 15, wherein a gate of the first transistor is coupled to a first bias voltage and a gate of the third transistor is coupled to an input signal.

20. The method of claim 19, wherein a gate of the second transistor is coupled to a second bias voltage.

* * * * *